US012651729B2

(12) United States Patent
Tso et al.

(10) Patent No.: US 12,651,729 B2
(45) Date of Patent: Jun. 9, 2026

(54) METHODS AND SYSTEMS FOR COOLING PLASMA TREATMENT COMPONENTS

(71) Applicant: Taiwan Semiconductor Manufacturing Company, LTD., Hsinchu (TW)

(72) Inventors: Cheng Kuang Tso, Hsinchu (TW); Chou-Feng Lee, Hsinchu (TW); Chih-Hsien Hsu, Hsinchu (TW); Chung-Hsiu Cheng, Banqiao (TW); Jr-Sheng Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/768,190

(22) Filed: Jul. 10, 2024

(65) Prior Publication Data

US 2024/0363312 A1     Oct. 31, 2024

Related U.S. Application Data

(63) Continuation of application No. 17/670,670, filed on Feb. 14, 2022, now Pat. No. 12,062,523.

(51) Int. Cl.
H01J 37/32          (2006.01)
H10P 50/24          (2026.01)

(52) U.S. Cl.
CPC .. H01J 37/32449 (2013.01); H01J 37/32522 (2013.01); H10P 50/242 (2026.01); H01J 2237/334 (2013.01)

(58) Field of Classification Search
None
See application file for complete search history.

(56) References Cited

U.S. PATENT DOCUMENTS

| | | | |
|---|---|---|---|
| 6,326,597 B1 * | 12/2001 | Lubomirsky | ..... H01L 21/67248 |
| | | | 118/723 R |
| 6,367,410 B1 * | 4/2002 | Leahey | ............. H01L 21/67103 |
| | | | 118/724 |
| 2004/0222189 A1 | 11/2004 | Fischer | |
| 2007/0138134 A1 * | 6/2007 | Hsieh | .................. H01J 37/3244 |
| | | | 257/E21.252 |
| 2011/0155058 A1 | 6/2011 | Carlson et al. | |
| 2014/0345526 A1 | 11/2014 | Ranish et al. | |
| 2018/0294143 A1 | 10/2018 | Chua et al. | |
| 2020/0152431 A1 * | 5/2020 | Lee | ................... H01J 37/32449 |
| 2020/0251312 A1 * | 8/2020 | Liu | .................... H01J 37/32119 |

* cited by examiner

*Primary Examiner* — Jeffrie R Lund
*Assistant Examiner* — Tiffany Z Nuckols
(74) *Attorney, Agent, or Firm* — Lippes Mathias LLP

(57)          ABSTRACT

Methods and systems for uniformly cooling a dome within a plasma treatment system are disclosed. The methods and systems utilize a diffuser including a perforated plate and a cone. The perforated plate includes a center portion and multiple arrays of holes with each array being located circumferentially at a different distance from the center. The cone extends away from the center. The diffuser spreads cooling gas more uniformly across the surface of the dome.

20 Claims, 13 Drawing Sheets

200

200

METHODS AND SYSTEMS FOR COOLING PLASMA TREATMENT COMPONENTS

CROSS-REFERENCE TO RELATED APPLICATIONS

This application is a divisional of U.S. patent application Ser. No. 17/670,670, filed on Feb. 14, 2022, now U.S. Pat. No. 12,062,523, which is incorporated by reference in its entirety.

BACKGROUND

Integrated circuits are formed on a semiconductor wafer. Photolithographic patterning processes use ultraviolet light to transfer a desired mask pattern to a photoresist on a semiconductor wafer. Etching processes may then be used to transfer to the pattern to a layer below the photoresist. This process is repeated multiple times with different patterns to build different layers on the wafer substrate and make a useful device. Plasma treatment is used for various applications in the integrated circuit production process, such as cleaning the wafer or for etching.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
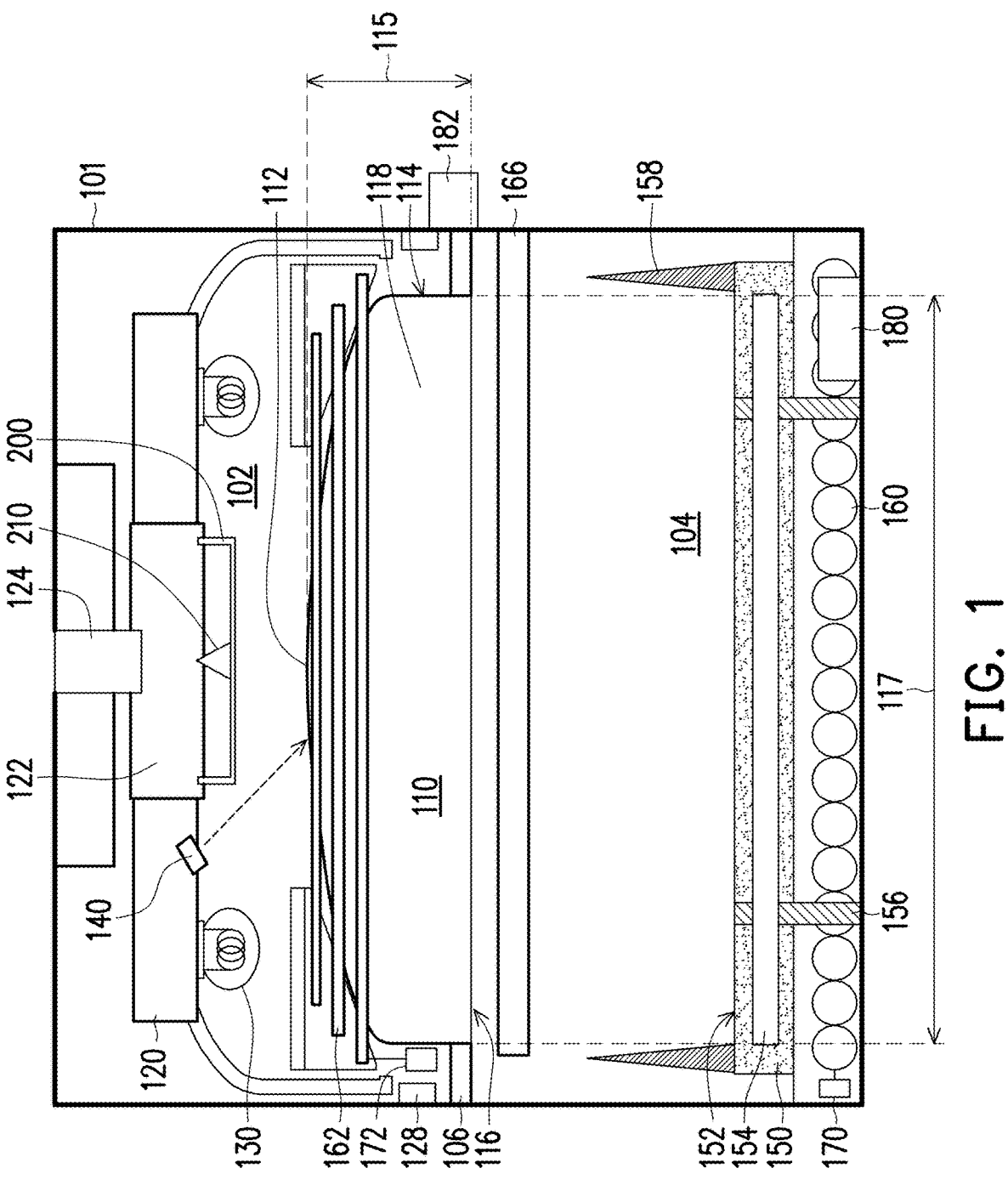
FIG. 1 is a side view of a plasma treatment system, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The present disclosure relates to devices and methods for uniformly cooling dome structures used in plasma treatment systems. Plasma treatment and plasma treatment tools are commonly used in integrated circuit fabrication processes. Those manufacturing steps and applications can include the cleaning of wafer substrates, etching processes, and wafer bonding processes such as fusion bonding. Very generally, plasma is produced by applying a radiofrequency (RF) electromagnetic field through a gas between two electrodes. The RF field ionizes the gas molecules and strips them of their electrons, creating a plasma. The ions bombard the wafer substrate, resulting in the desired functions. In certain etchers that use inductively coupled plasma (ICP) or transformer-coupled plasma (TCP), the electrode(s) is separated from the plasma by a dielectric window.

Temperature control of the various components of plasma treatment systems used in plasma treatment processes to etch, implant, or deposit material on semiconducting wafer substrates is important to provide reliable and reproducible semiconductor fabrication processes. Many such processes are highly temperature dependent and provide different processing rates or characteristics at different temperatures. In etching processes, for example, temperature fluctuations may cause the shape of etched features on the substrates to vary as a function of the temperature profile across the substrate. Large temperature fluctuations of chamber components can cause residues deposited on the chamber walls or dome to become detached and contaminate the substrate. Additionally, ceramic materials often have a low thermal shock resistance and are prone to cracking when subjected to thermal stresses resulting from large temperature variations. Ceramic materials having high thermal expansion coefficients undergo significant expansion or contraction upon exposure to fluctuating temperatures. Such exposures may cause cracking or breaking of deposited materials and/or the ceramic dome structure itself.

The plasma treatment systems and methods include a plasma treatment chamber and a cooling chamber. A dome is present between the two chambers, and the two chamber are isolated from each other. A diffuser is used in the cooling chamber. The diffuser includes a perforated plate having a central portion and a plurality of arrays of holes. Each array of holes is distributed circumferentially at a different distance from the central portion. The diffuser further includes a cone in the central portion that extends away from the dome. The diffuser directs cooling gas flow onto the dome and reduces the gas velocity, increasing the temperature uniformity of the dome. In some particular embodiments, the variation of the temperature on the dome surface may be less than or equal to 5%.

FIG. 1 is a side cross-sectional schematic diagram of an example plasma treatment system 100 in accordance with some embodiments of the present disclosure.

The system includes a housing 101 that contains a cooling chamber 102 and a plasma treatment chamber 104. The cooling chamber is located over or above the plasma treatment chamber. The system also includes a dome 110 located between the cooling chamber 102 and the plasma treatment chamber 104.

The cooling chamber 102 and the plasma treatment chamber 104 are isolated from each other. In other words, there is no exchange of gas, liquid, or other materials between the cooling chamber 102 and the plasma treatment chamber 104. This isolation is done structurally, and in FIG. 1 is done by the dome 110 and an annular horizontal wall 106 surrounding the dome.

Referring first to the dome 110, the dome is made of a material that is configured to transmit RF energy, or in other words the dome is generally transparent to RF. An RF induction field is typically transmitted by an inductor antenna within the cooling chamber and through the dome. Thus, the dome desirably has a low impedance to the RF induction field of the inductor antenna or has an electric field susceptibility sufficiently low to transmit the induction field through the dome with minimal power loss. A suitable composition for the dome has high transmittance (i.e., low loss tangent) across RF frequencies. If RF transmittance is low, energy may undesirably be absorbed and converted into excessive heat. Such heat may both degrade the plasma treatment process due to lost RF energy while also causing excessive heating of components and the creation of thermal gradients. The dome material should also resist erosion from the plasma treatment environment.

In some embodiments, the dome is made of a ceramic material. Non-limiting examples of ceramic materials that can be used to make the dome 110 include silicon, silicon dioxide ($SiO_2$), silicon carbide, alumina ($Al_2O_3$), germanium, Group III-V compound semiconductors such as gallium arsenide and indium phosphide, and Group II-II-V compound semiconductors such as mercury cadmium-telluride. In some specific embodiments, the dome is made from silicon dioxide ($SiO_2$) or alumina ($Al_2O_3$).

During the plasma treatment process, the dome 110 may capture byproducts and polymer etchant particles generated in the plasma treatment chamber 104. Such byproducts may come, for example, from the photoresist on a wafer substrate that is being etched, or from the metal films being etched, or the etchant gases. When these byproducts and other particles adhere to the dome, they do not land on the wafer substrate. Thus, the dome aids in keeping the plasma treatment chamber cleaner and/or preventing the byproducts/particles from re-depositing onto the wafer.

In some embodiments and as illustrated in FIG. 1, the dome 110 may include a top portion 112 that correspond in shape to a portion of a sphere cut off by a plane (i.e. a spherical dome), and may be hemispherical. The dome may also include a circumferential sidewall 114 that extend downward from the top portion 112. The overall dome 110 has a height 115 and a diameter 117. The dome may also be described as having a first surface 116 facing the wafer substrate or within the plasma treatment chamber 104, and having a second surface 118 facing away from the wafer substrate or within the cooling chamber 102.

Referring now to the cooling chamber 102, the top of the cooling chamber is defined by an annular insulating cover 120 which surrounds a cooling pipe 122. A cooling gas is fed into the cooling chamber through a cooling gas inlet 124 and through the cooling pipe 122. The diffuser 200 of the present disclosure is attached to the insulating cover 120, and will be described in further detail herein. For now, it is noted that the diffuser 200 includes a cone 210 which faces the gas inlet 124. It should be noted that the gas inlet 124 has a smaller diameter than the dome diameter 117. This is why the diffuser is needed—to direct the cooling gas flow across the entire surface of the dome, rather than just being focused on the portion of the dome that is directly below the gas inlet.

One or more heat sources 130 (illustrated here as bulbs) may also be present within the cooling chamber 102 to generate heat for controlling the dome temperature within a set temperature range. A temperature sensor 140 (e.g. an infrared sensor) is configured to measure the temperature of the dome surface. An upper electrode or RF coil 162 may be located above the dome 110 within the cooling chamber 102. This electrode/coil is used during plasma generation.

One or more cooling gas outlets 128 are also present in the cooling chamber. In use, cooling gas passes from the cooling gas inlet 124 through the diffuser 200 towards the dome 110. The cooling gas may flow across the entire surface of the dome and exit through the cooling gas outlets 128, which are illustrated here as being near the horizontal wall 106.

Referring now to the plasma treatment chamber 104, a wafer support pedestal 150 is present within the housing. The pedestal may be configured to hold a semiconductor wafer substrate (not shown) in a desired position. The pedestal 150 includes a support surface 152 which contacts the wafer substrate. The support surface itself is usually made of an electrically insulating material.

In particular embodiments, the pedestal is in the form of an electrostatic chuck that uses an electrostatic holding force to secure the wafer substrate. As illustrated here, the pedestal includes a chuck electrode 154 located below the support surface 152. Extending through the chuck electrode and the support surface are loading pins 156, which can be used to raise and lower the wafer substrate. In some embodiments, channels may be provided on the back side of the electrostatic chuck for providing gases or fluids to cool the wafer substrate during plasma treatment. In this way, warpage and/or other damage to the wafer substrate may be reduced or minimized.

Alternatively, the pedestal may apply vacuum pressure to hold the wafer substrate in place by suction. As yet another alternative, the pedestal may interact mechanically, for example using clamps or retaining rings or the like, to hold the wafer substrate in place using a mechanical holding force.

A focus ring 158 is also present around the wafer support surface 152. The focus ring is designed to improve etch uniformity around the wafer edge or perimeter, by permitting the plasma to extend beyond the wafer perimeter and focusing the electric field within the focus ring. The focus ring is typically made of an insulating material, e.g. quartz, and is a consumable part that is periodically replaced.

Continuing, a lower electrode 160 is located below the wafer support surface 152, and an upper electrode 162 is located above the wafer support pedestal 150. The dome 110 is also located above the wafer support pedestal 150. The dome 110 is located between the wafer support pedestal 150 and the upper electrode 162, and physically separates the upper electrode 162 from the interior of the plasma treatment chamber 104. Similarly, the lower electrode 160 may also be isolated from the interior of the reaction chamber. The electrodes may be, for example, in the shape of a planar coil. The electrodes are used to provide energy for ionizing gas molecules so as to generate a plasma.

The system also includes a gas inlet 166, through which process gases are introduced into the plasma treatment chamber. It should be understood that these process gases are not the cooling gas described above which does not enter the plasma treatment chamber. The gas inlet may be in the form of, for example, a showerhead and/or gas lines for supplying the process gases. The showerhead and/or gas lines are connected to gas sources (not shown) for providing the specified gas. One or more gas outlets 180 is also present for removing undesired gases, and for reducing the pressure within the plasma treatment chamber. A gas outlet can be connected to a pump (not shown) for creating vacuum. A door (not shown) is also present for accessing the plasma treatment chamber, to insert and remove the wafer substrate.

Radiofrequency (RF) generators are present for applying RF power. A lower RF generator 170 is coupled to the lower electrode 160, and an upper RF generator 172 is coupled to the upper electrode 162.

A controller 182 is used to control the various inputs and outputs, and to measure various conditions within the housing for both the cooling process and the plasma treatment process. The system may also include sensors (not shown) for monitoring applicable parameters. For example, such sensors may include those for tracking the flow rate of various gases, for measuring the content of gases exiting the plasma treatment chamber, for measuring the pressure within the plasma treatment chamber, the temperature of the wafer substrate, the temperature of the cooling gas, the temperature of the dome (i.e. sensor 140), etc. The controller can also determine whether to activate or deactivate the system, how to vary the voltage to the electrodes, how to vary the gas mixture, how fast/strongly the cooling gas should flow into the cooling chamber, and potentially also control the motion of any automated handling system that may be present, etc. It is noted that these various parameters may not have to be held steady during operation, and could be changed by the controller operating a computer program which alters their setpoints as appropriate. The controller may also include a user interface for communicating with operators. If desired, different controllers may be used for controlling the cooling chamber and the plasma treatment chamber.

The controller may be implemented on one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. Such devices typically include at least memory for storing a control program (e.g. RAM, ROM, EPROM) and a processor for implementing the control program.

The various components of the plasma treatment system may be made using materials and processes known in the art. Examples of suitable materials can include metals, plastics, etc. Common enhancements may also be used. For example, the various surfaces within the plasma treatment chamber may include a protective coating.

Figure 2:
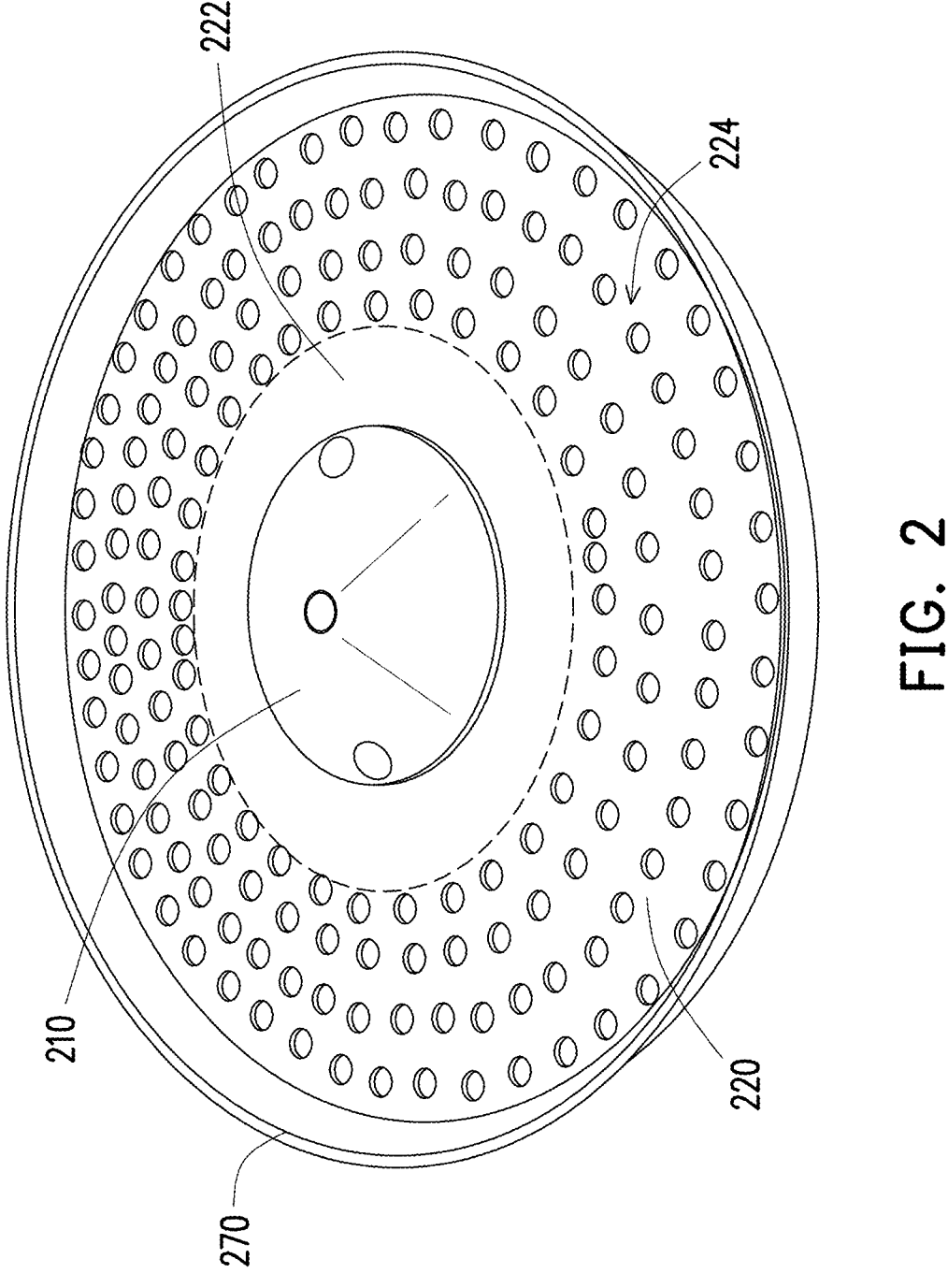
FIG. 2 is a perspective view of a diffuser, in accordance with some embodiments of the present disclosure.
Figure 3:
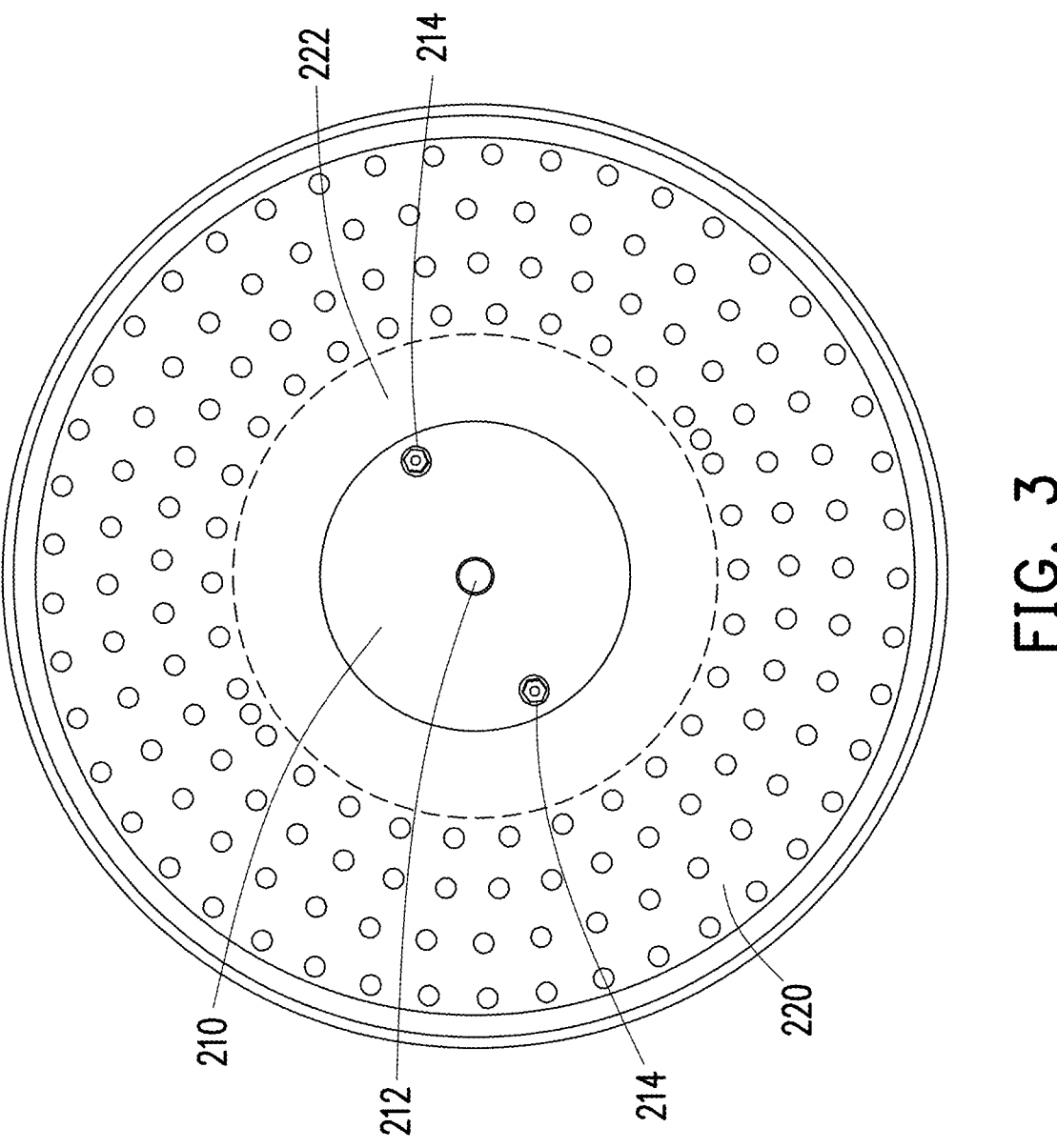
FIG. 3 is a top view of the diffuser of FIG. 2.
Figure 4:
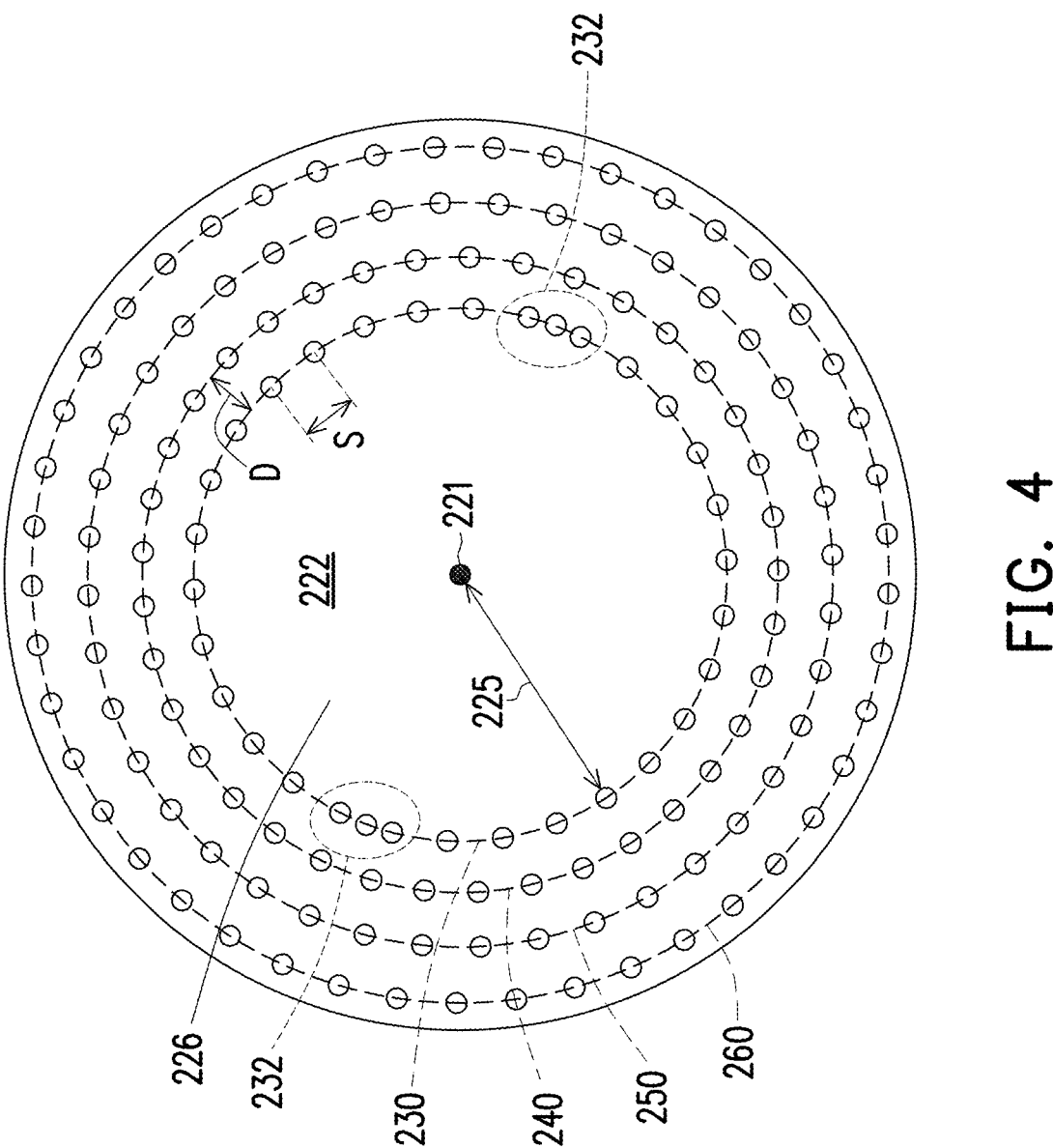
FIG. 4 is a bottom view of the diffuser of FIG. 2.
Figure 5:
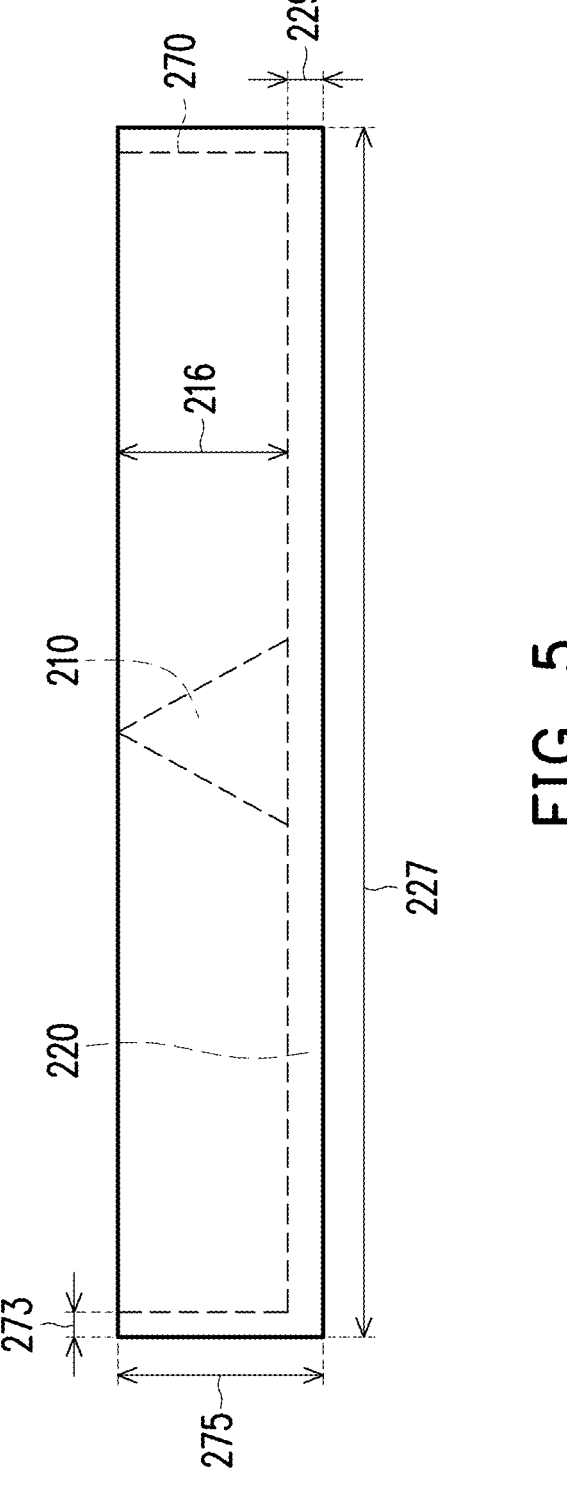
FIG. 5 is a side view of the diffuser of FIG. 2.

FIGS. 2-5 are various views of the diffuser 200 present in the cooling chamber 102 of the plasma treatment system 100. FIG. 2 is a perspective view of the diffuser 200. FIG. 3 is a top view of the diffuser 200. FIG. 4 is a bottom view of the diffuser 200. FIG. 5 is a side view of the diffuser 200.

Referring first to the perspective view of FIG. 2, the diffuser 200 comprises a cone 210 and a perforated plate 220. A circumferential outer sidewall 270 extends from and is present around the circumference of the perforated plate. The cone is located on an upper surface 224 of the perforated plate, within a central portion 222 of the plate.

Referring back to FIG. 1, the top view of FIG. 3 shows the surface of the diffuser that faces the gas inlet 124, and faces away from the plasma treatment chamber 104. As seen in FIG. 3, the cone 210 has a central hole 212 at the vertex of the cone. In some embodiments, the cone 210 is made separately from the perforated plate 220. In that case, two secondary holes 214 may be present, and can be used for securing the cone to the perforated plate.

Although the cone may generally have any radius, in particular embodiments, the cone has a radius of about 10 mm to about 27 mm. In a specific embodiment, the cone has a radius of about 23.4 millimeters (mm). Similarly, although the cone may generally have any height, in particular embodiments, the height of the cone is about 20 mm. Referring back to FIG. 1, the cone 210 may have a height sufficient to extend partially into the cooling pipe 122 and/or cooling gas inlet 124, or may not. Referring to FIG. 5, the height 275 of the outer sidewall may be equal to or greater than the height 216 of the cone.

Referring back to FIG. 3 and the central hole 212, the cone itself is generally hollow. Cooling gas may thus enter the cone to cool the part of the central portion 222 of the perforated plate that is covered by the cone 210. In particular embodiments, the central hole may have a diameter of about 1 mm.

When comparing the bottom view of FIG. 4 to the top view of FIG. 3, it is noted that the cone 210 does not fill the entire central portion 222 of the perforated plate.

Continuing now with FIG. 4, the lower surface 226 of the plate is shown. The perforated plate 220 includes a solid central portion 222 and a plurality of arrays of holes. Each array 230, 240, 250, 260 extends circumferentially around the central portion. The perforated plate is generally circular. The geometric center of the perforated plate is indicated with reference numeral 221, and does not represent a hole. The center 221 is generally concentric with the cone central hole 212.

The central portion 220 of the perforated plate is distinguished by having no perforations. The radius 225 of the central portion (i.e., the distance from the geometric center 221 of the perforated plate to the first array of holes 230) may be any desired distance, and in particular embodiments may be about 47.5 mm. The radius 225 of the central portion may be configured to avoid focusing too much cooling gas on the center of the dome, which does not tend to get as hot as the edges of the dome.

As illustrated in FIG. 4, four arrays 230, 240, 250, 260 of holes are present. However, other numbers of arrays are also expressly contemplated herein. In some embodiments, at least three arrays of holes are present. The number of arrays is generally at most seven. Each array is a set of holes at generally the same radius from the center of the perforated plate, and a single circular line will pass through all of the holes in a given array. Here, dotted lines are used to indicate each array. Array 230 is the innermost array, and array 260 is the outermost array.

The holes in a given array are generally identical. The holes in the arrays present on a perforated plate are generally identical to each other as well, although it is contemplated that both the number of holes and the size of the holes may vary between arrays. The holes are usually circular, but other shapes could be used as desired. In particular embodiments, the holes may have a diameter of about 3 mm to about 6 mm. If the holes are too large, pressure may be too low and the resulting gas flow rate may be too low, causing the cooling gas to be focused toward the center of the dome. If the holes are too small, the gas flow rate may be too high, leading to cooling inefficiency. Desirably, the gas flow rate through the diffuser is about 2 liters per minute (L/min) to about 4 L/m, including from about 3 L/min to about 4 L/min.

With a given array, adjacent holes may be spaced apart from each other at a distance S of from about 3 mm to about 10 mm.

The number of holes in each array may vary depending on the size of the holes, the distance between adjacent holes, and the radius of the array from the center of the perforated plate. In particular embodiments, the first array of holes 230 and the second array of holes 240 may independently have from about 28 to about 40 holes. In additional embodiments, the third array of holes 250 and the fourth array of holes 260 may independently have from about 40 holes to about 54 holes. In some specific embodiments, the first array of holes has about 32 holes, the second array of holes has about 36 holes, the third array of holes has about 48 holes, and the fourth array of holes has about 48 holes.

Referring again to FIG. 4, the innermost array 230 may include one or more sets 232 of continuous holes (e.g., three holes). These sets are for securing the diffuser 200 to the insulating cover 120 at the top of the cooling chamber 102. Two ways of securing are contemplated. First, fasteners may be passed through the two outer holes of each set to perform the securing function, and the inner hole (i.e., any hole in the plurality of continuous holes that is not an end hole) may be used to distribute cooling gas towards the dome. Second, a fastener may be passed through the inner hole of each set to perform the securing function, and the two outer holes are used to distribute cooling gas towards the dome. The fasteners may be screws, pins, or nails.

In various embodiments, the distance from the center 221 of the perforated plate to the first array of holes 230 may be from about 45 to about 50 mm, including about 47.5 mm.

In various embodiments, the distance from the center 221 of the perforated plate to the second array of holes 240 may be from about 50 to about 60 mm, including about 55.8 mm.

In various embodiments, the distance from the center 221 of the perforated plate to the third array of holes 250 may be from about 60 to about 70 mm, including about 65.8 mm.

In various embodiments, the distance from the center 221 of the perforated plate to the fourth array of holes 260 may be from about 70 to about 77 mm, including about 75.8 mm.

The distance between adjacent arrays of holes D may independently be about 8 mm to about 12 mm. This may vary depending on the sizes of the holes and to maintain pressure differences that can affect the cooling efficiency/performance.

Referring now to FIG. 5, various dimensions are shown in dotted line. The thickness 229 of the perforated plate may range from about 1 mm to about 5 mm, including from about 1.5 mm to about 2.5 mm, and about 2 mm. The perforated plate has a diameter 227 which may vary as desired. In particular embodiments, the diameter is from about 150 mm to about 200 mm, including about 160 mm.

The outer sidewall 270 may have a thickness 273 that is the same as or different from the perforated plate, and may also range from about 1 mm to about 5 mm, including about 2 mm. The outer sidewall may have a height 275 as desired, and in particular embodiments from about 15 mm to about 25 mm, including about 20 mm.

The perforated plate 220 and the outer sidewall 270 are usually formed as a unitary or single structure, at the same time. In some embodiments, the perforated plate, the sidewall, and the cone are formed as a unitary structure. The diffuser parts may be made from any suitable material, such as stainless steel.

Figure 6:
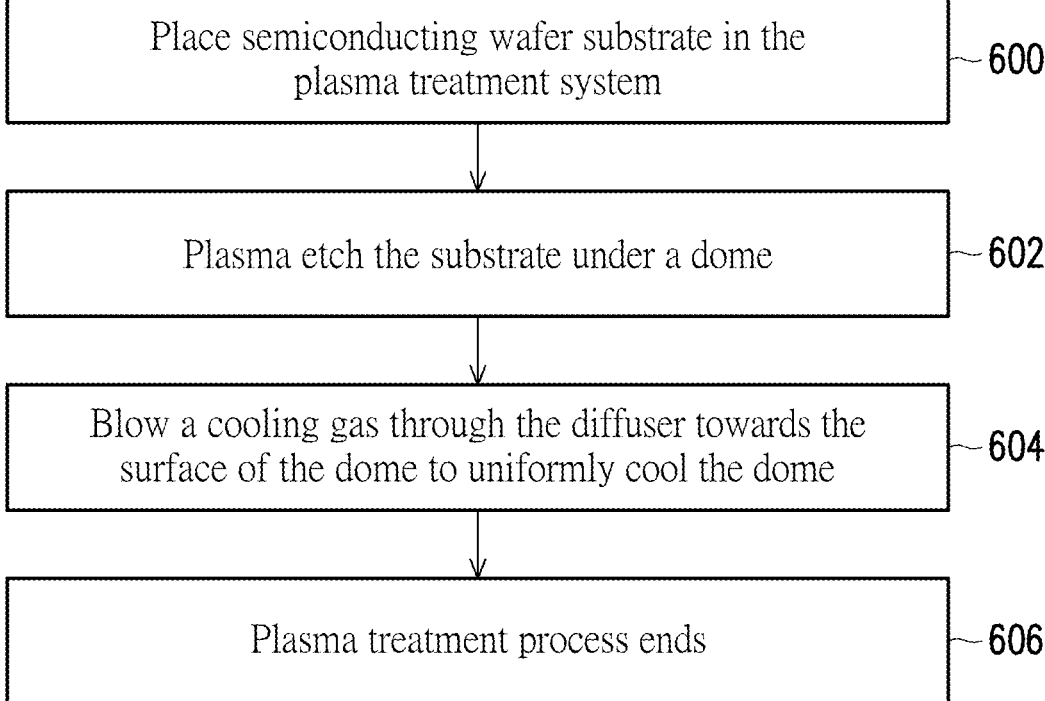
FIG. 6 is a flowchart illustrating a method for uniformly cooling a dome used in a plasma treatment tool, and a plasma etching method, in accordance with some embodiments.
Figure 7:
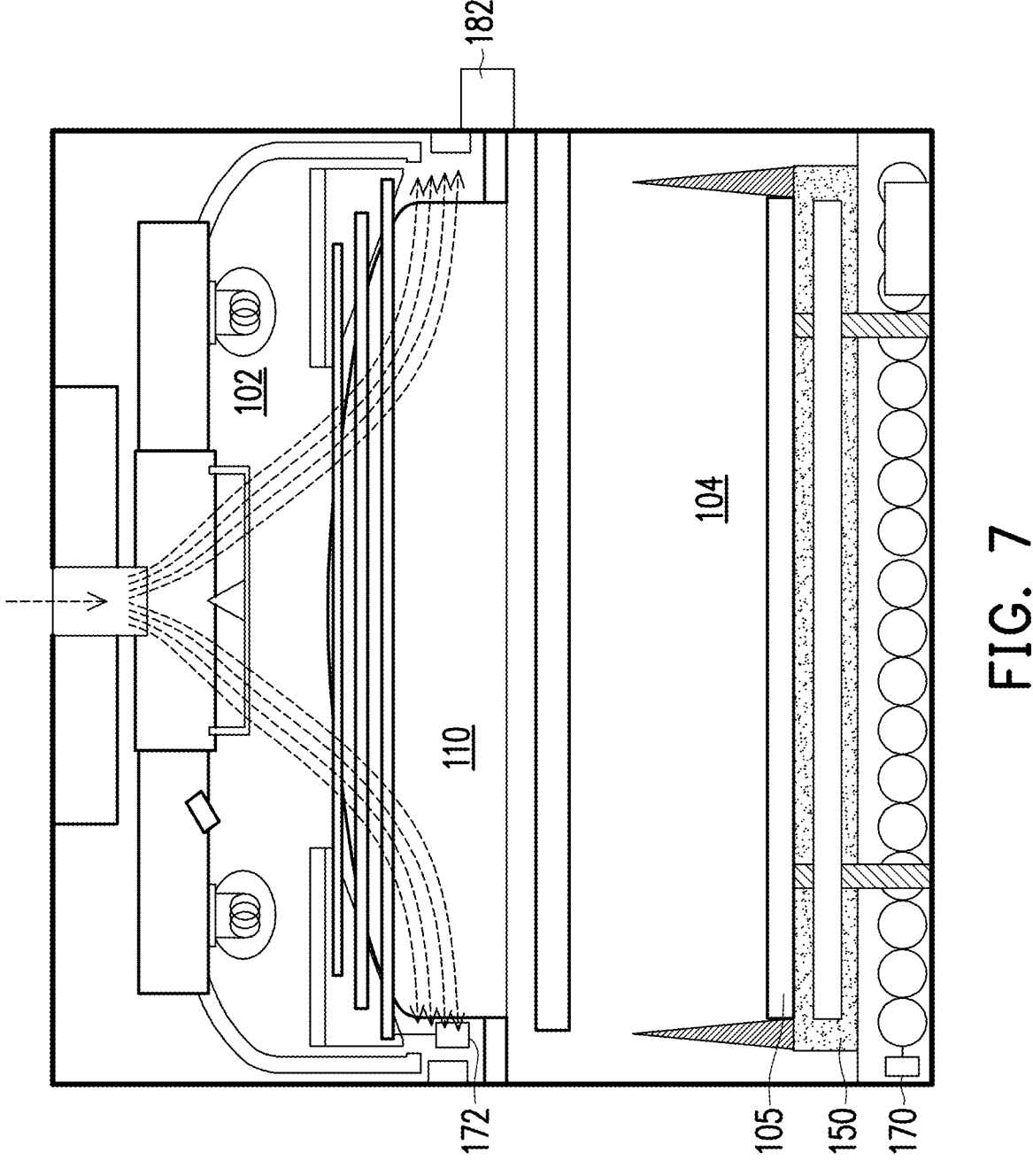
FIG. 7 is a side cross-sectional view illustrating the plasma treatment system or tool in use in a plasma etching process.
Figure 8:
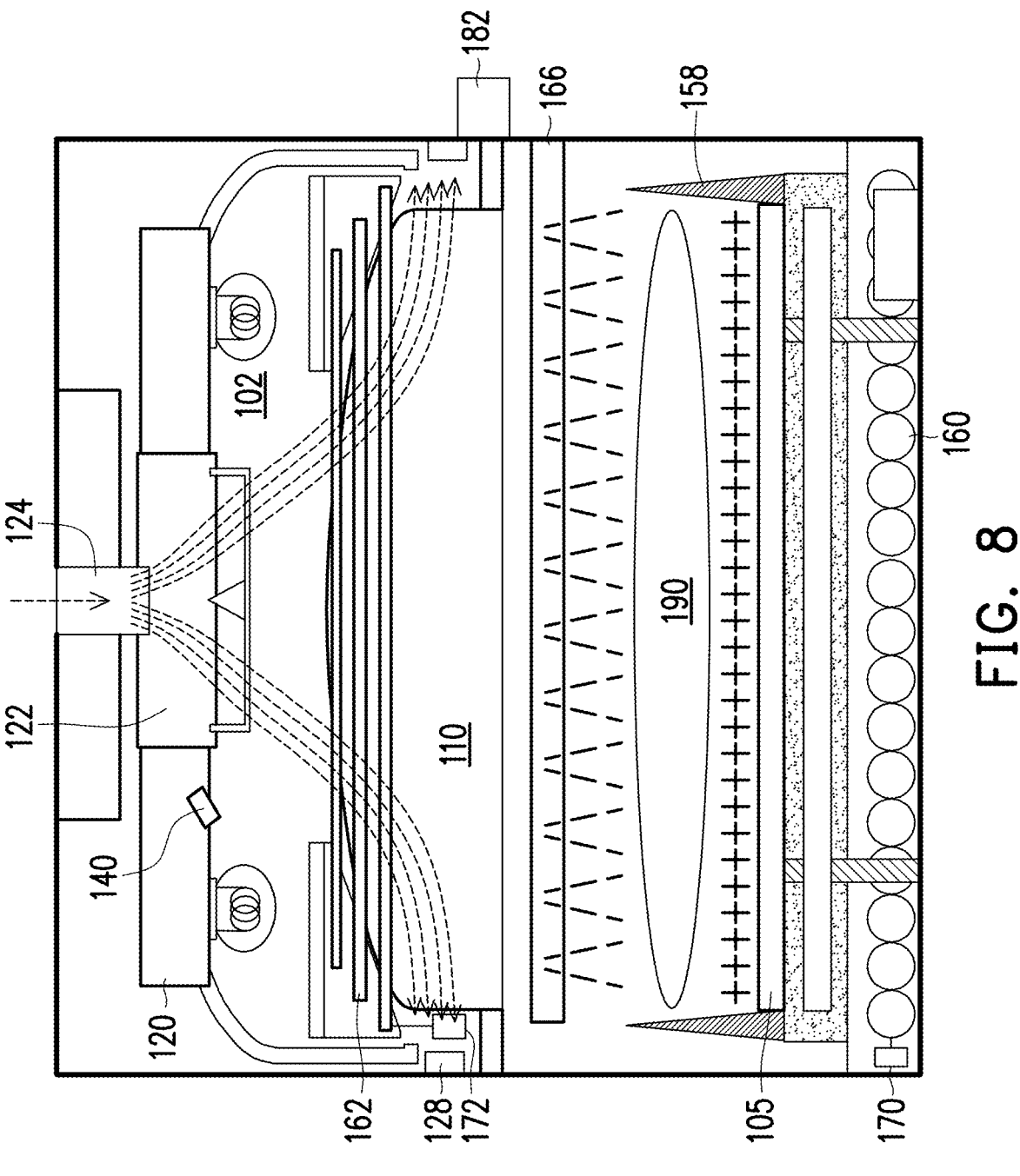
FIG. 8 is a side cross-sectional view showing the plasma treatment system or tool of FIG. 7 performing plasma treatment on a wafer substrate.
Figure 9:
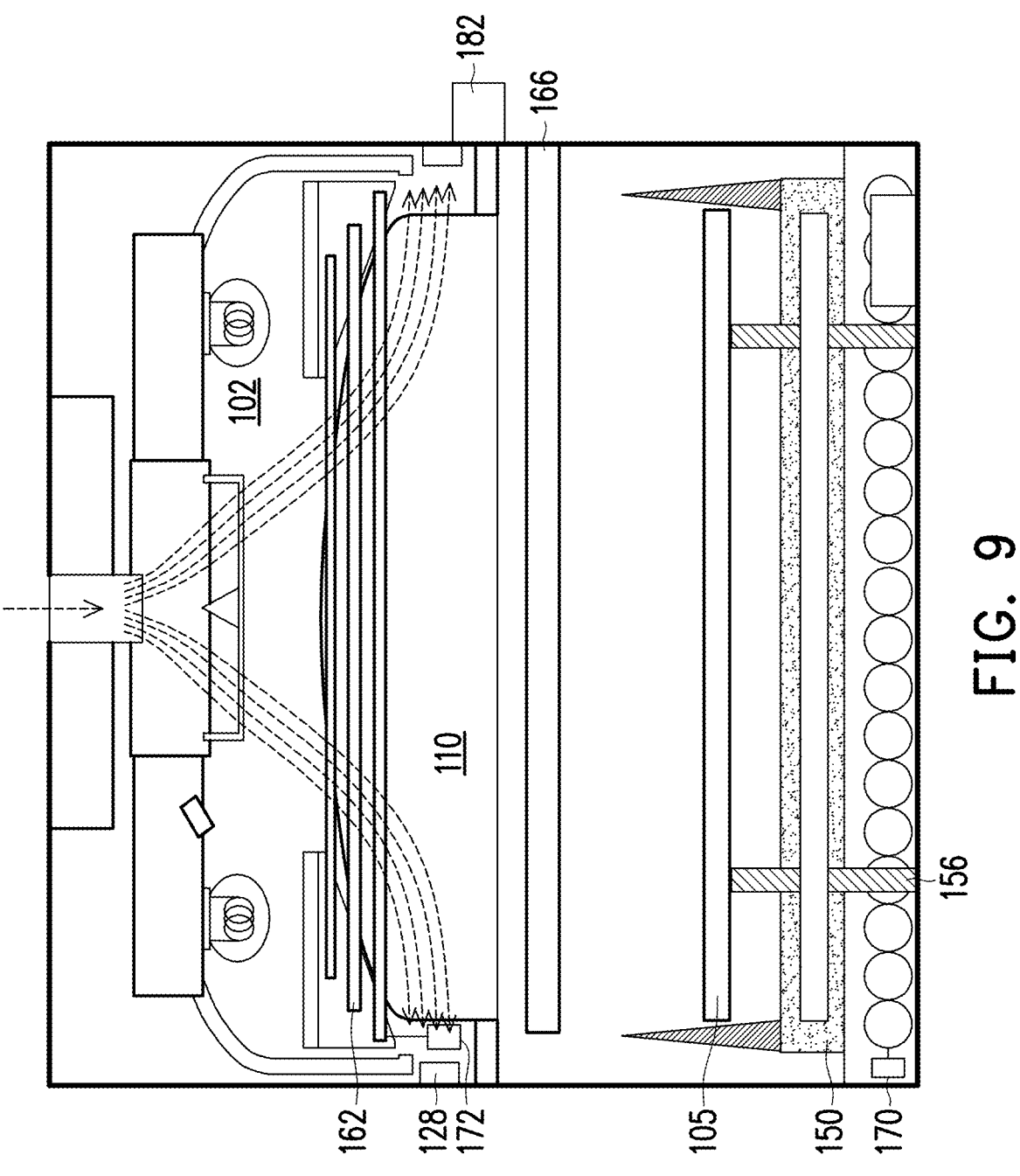
FIG. 9 is a side cross-sectional view showing the plasma treatment system or tool of FIG. 7 after plasma treatment, with loading pin cushions contacting the wafer substrate to dissipate residual charge.

FIG. 6 is a flowchart illustrating a method for uniformly cooling a dome used in a plasma treatment system, and for plasma etching using the plasma treatment system or tool, according to some embodiments of the present disclosure. Some of the method steps are illustrated in FIGS. 7-9.

In step 600, a semiconducting wafer substrate 105 is placed in the plasma treatment system 100. As illustrated in FIG. 7, the wafer substrate 105 is placed on the wafer support pedestal 150. As indicated here as well, the flow of cooling gas into the cooling chamber 102 can be started for cooling the dome 110.

When used for production, the wafer substrate itself can be a wafer made of any semiconducting material. Such materials can include silicon, for example in the form of crystalline Si or polycrystalline Si. In alternative embodiments, the substrate can be made of other elementary semiconductors such as germanium, or may include a compound semiconductor such as silicon carbide (SiC), gallium arsenide (GaAs), indium arsenide (InAs), and indium phosphide (InP).

Next, in step 602, the wafer substrate is plasma etched. As illustrated in FIG. 8, plasma treatment is performed upon the wafer substrate 105. The plasma treatment can be performed, for example, as part of a dielectric barrier discharge (DBD) process, a reactive ion etching (RIE) process, or a sequential plasma (SPAB) process. Voltage provided by the RF generators 170, 172 is applied between the upper electrode 160 and the lower electrode 162 to ignite and sustain a plasma 190, which is focused above the wafer substrate by the focus ring 158. The radiofrequency is usually operated at 13.56 megahertz (MHz), although other frequencies such as 2 MHz or 60 MHz may be used, depending on the application. The power used to generate the plasma may range from about 10 watts (W) to about 2,000 W. Once ignited, the plasma can be sustained by electric currents produced by electromagnetic induction associated with time-varying magnetic fields, or can become self-sustaining.

In some embodiments, the plasma treatment is performed in a vacuum environment, for example with the pressure within the housing being from about 0.1 pascals (Pa) to about 100 Pa. However, the pressure may be higher and could simply be sub-atmospheric, for example a pressure of about 10 kPa to about 95 kPa (for comparison, atmospheric pressure is about 101 kPa).

The process gas used for generating the plasma may include one or more gases that enter through the showerhead 166. Depending on the application, for example, the process gases may include nitrogen ($N_2$), hydrogen ($H_2$), argon (Ar), helium ($H_2$), fluorine ($F_2$), chlorine ($Cl_2$), oxygen ($O_2$), hydrogen bromide (HBr), hydrofluoric acid (HF), nitrogen trifluoride ($NF_3$), or sulfur hexafluoride ($SF_6$), or hydrofluorocarbons of the general formula $C_xH_yF_z$. Due to the plasma treatment, a residual voltage may remain on the wafer substrate, indicated here as a positive charge on the wafer substrate 105.

In step 604 and as further illustrated in FIG. 8, during the plasma treatment process, cooling gas is flowing through the cooling gas inlet 124, the cooling pipe 122, and the diffuser 200 (as indicated by arrows) into the cooling chamber 102. The cooling gas is blown or directed towards the dome 110. In some embodiments, the cooling gas is compressed dry air (CDA). The cooling gas directed through the diffuser towards the dome may enter through the gas inlet at a temperature in the range of about 20° C. to about 25° C. The cooling gas flows over the dome and out the gas outlets 128.

During the plasma treatment process, the temperature in the plasma treatment chamber 104 just above the substrate may be in the range of about 70° C. to about 80° C. During the plasma etching process, gaseous byproducts are condensing on the dome 110.

In step 606, the plasma treatment process ends. In FIG. 9, the plasma treatment is complete. The loading pins 156 are raised to elevate the wafer substrate 105 above the pedestal 150. The loading pins now contact the bottom of the wafer substrate to dissipate any residual charge on the wafer substrate. Automated handling tools (not shown) can then grasp the wafer/semiconductor wafer substrate to a subsequent processing tool. The flow of cooling gas may continue here as well.

The systems and methods of the present disclosure provide the advantage of more uniformly cooling the dome by distributing the cooling gas flow around the entire surface of the dome, rather than being concentrated in one location. The inclusion of the diffuser can reduce the speed of the cooling gas, thereby allowing for better control of temperature uniformity. In particular embodiments, the variation of the temperature on the dome surface may be less than or equal to 5%.

In the absence of the diffuser, the dome may get hotter at the edge of the dome compared to the center of the dome. Furthermore, the dome may get hotter at the bottom of the dome than the top of the dome.

In some embodiments, the dome is maintained at a temperature in the range of about 80° C. to about 100° C. If the dome temperature is too cold, the byproducts or polymer etchant may become too heavy and can peel off the dome and fall onto the wafer substrate, damaging the integrated circuits formed thereon. If the dome temperature is too high, the polymer may not deposit on the dome and remain in the atmosphere of the plasma treatment chamber, again possibly contaminating the wafer substrate. Overly high temperatures may also damage the dome. It is noted that the temperature of the dome should be maintained uniformly during the entire plasma treatment process.

The plasma treatment system or tool can be used for performing dry etching. Dry etching can be used to form trenches and/or vias in a layer, and is a highly anisotropic process for obtaining high aspect ratios (i.e. predominantly vertical walls). For dry etching, for example, a patterned photoresist layer is present over a metal layer on the wafer substrate. The plasma treatment tool is then used to etch the exposed metal. Etch products may include for example, FCN, $CO_x$, $SiCl_x$, and/or $SiF_x$.

In particular embodiments, the plasma treatment system/tool is used for patterning of aluminum-copper (AlCu) alloy thin films. AlCu alloy is widely used as a very large-scale integration (VLSI) interconnection metal for semiconductor devices due to its high conductivity, good ductility, and good adhesion to the underlying substrate. The patterning of AlCu is commonly done using reactive ion etching (RIE). Suitable etchant gases contain chlorine, such as $BCl_3$, $Cl_2$, $CCl_4$, and $SiCl_4$. Other gases can be added for anisotropic etching, such as $CHCl_3$, $N_2$, $CHF_3$, and $C_2H_4$.

Figure 10A:
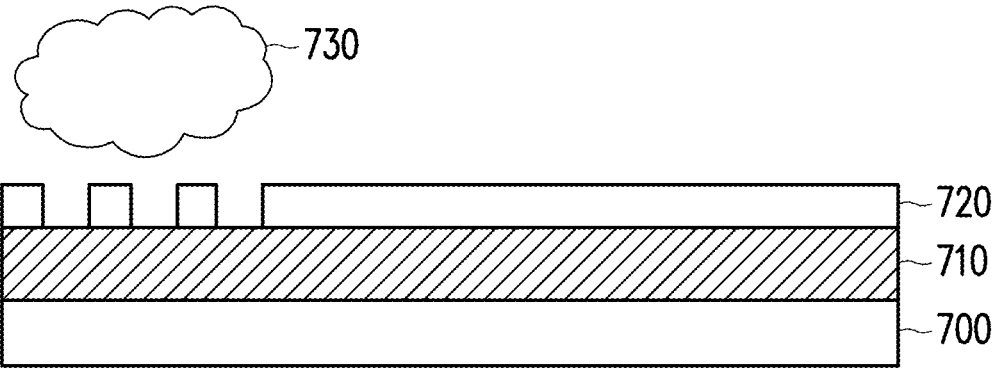
FIG. 10A and FIG. 10B are diagrams illustrating a dry etching process performed using a plasma treatment tool, in accordance with some embodiments.
Figure 10B:
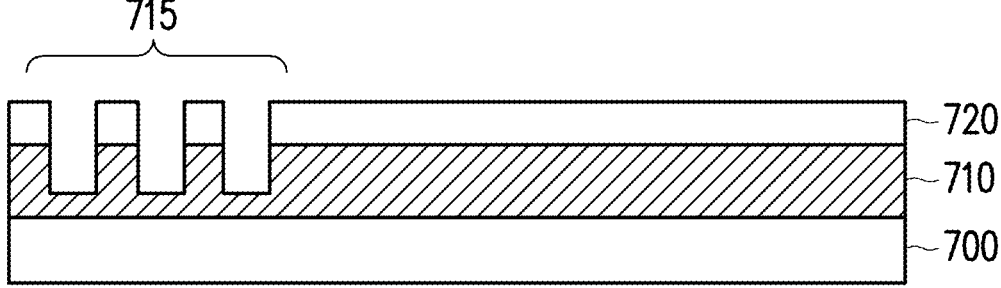

FIG. 10A and FIG. 10B are side cross-sectional views illustrating the dry etch process. In FIG. 10A, a metal layer 710 is present on a silicon substrate 700, and a photoresist layer 720 upon the metal layer has been patterned. The metal layer is then dry etched using plasma 730. Referring now to FIG. 10B, a trench 715 is present in the metal layer.

The plasma treatment tool can also be used for cleaning. The plasma treatment can remove contaminants from the surface of a wafer substrate. In addition, the surface is made hydrophilic by increasing the number of —OH groups on the surface, which may be beneficial for forming strong fusion bonds when wafer-to-wafer bonding is desired.

Some embodiments of the present disclosure thus relate to plasma etching methods. A substrate is plasma etched beneath a dome which includes a first surface facing the substrate and a second surface facing away from the substrate. A cooling gas flows through a diffuser towards the second surface of the dome to more uniformly cool the dome. The diffuser includes a perforated plate having a central portion and multiple arrays of holes. Each array is located circumferentially at a different distance from the central portion. The diffuser also includes a cone extending from the central portion and away from the dome.

Other embodiments of the present disclosure relate to plasma etching systems. The plasma etching systems include a plasma etching chamber, a dome cooling chamber, and a diffuser within the dome cooling chamber. The plasma etching chamber includes a dome having an inner surface partially defining the plasma etching chamber. The dome cooling chamber includes a gas inlet and is partially defined by an outer surface of the dome. The diffuser is in fluid communication with the gas inlet and includes a perforated plate having a central portion and multiple arrays of holes. Each array is located circumferentially at a different distance from the central portion. The diffuser also includes a cone extending from the central portion and away from the dome. The diffuser further includes an outer sidewall extending from an outer circumference of the perforated plate and away from the dome.

Also disclosed in various embodiments are methods for uniformly cooling a dome used in a plasma treatment process. The methods include providing a cooling gas through a diffuser towards a surface of the dome. The diffuser includes a perforated plate having a central portion and multiple arrays of holes. Each array is located circumferentially at a different distance from the central portion. The diffuser further includes a cone extending from the central portion and away from the dome.

Although the systems and methods of the present disclosure are described particularly in reference to uniformly cooling a dome structure during plasma treatment, other applications are also contemplated. For example, the systems and methods may be used to cool a dome structure in other applications wherein the temperature beneath the dome is elevated and uniform control of the dome temperature is important. Furthermore, the system and methods may also be used to uniformly heat a dome structure in other applications where the temperature beneath the dome is relatively low and uniform control of the dome temperature is important.

The methods and systems of the present disclosure are further illustrated in the following non-limiting working example, it being understood that the example is intended to be illustrative only and that the disclosure is not intended to be limited to the materials, conditions, process parameters and the like recited herein.

EXAMPLE

Three different diffuser configurations were tested in a plasma etching process. The polymer distribution on the dome was used as a proxy for temperature uniformity.

Figure 11:
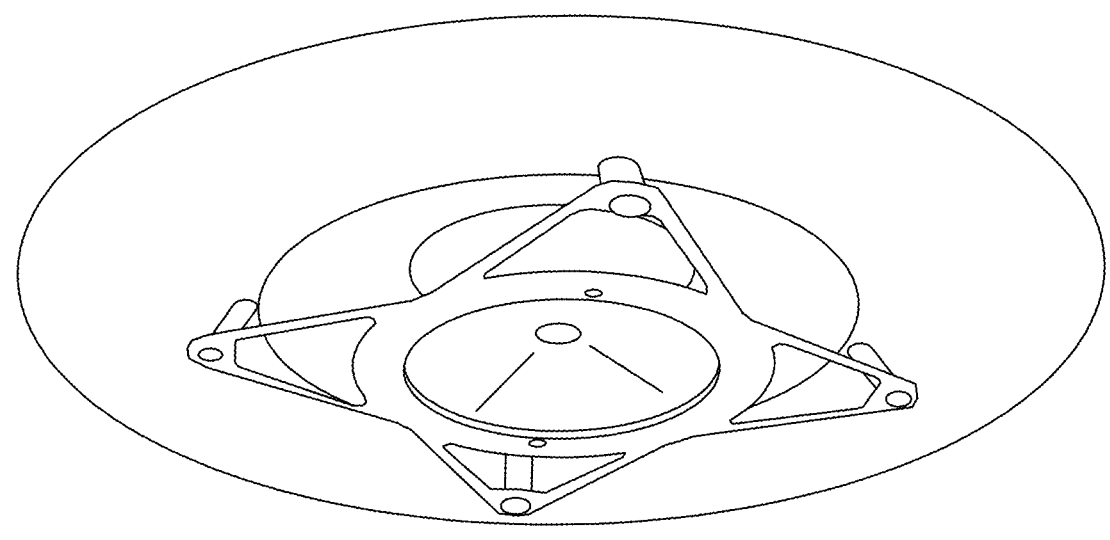
FIG. 11 is an illustration of the diffuser used in Example 1.
Figure 12:
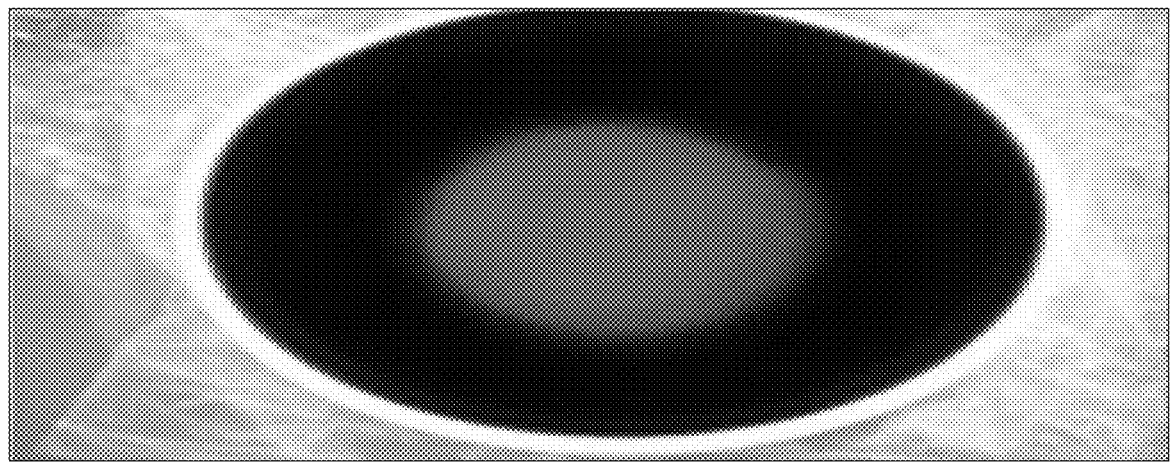
FIG. 12 is a photograph of the dome after etching in Example 1.

In Example 1, the diffuser included a central cone without a perforated plate, as illustrated in FIG. 11. FIG. 12 is a photograph of the dome of Example 1 after the test. The difference in color seen in FIG. 12 indicates non-uniform polymer distribution, or in other words non-uniform temperature across the surface of the dome. The temperature was cooler in the center of the dome. In Example 1, the wind speed was 19 to 21 liters per minute (L/min).

Figure 13:
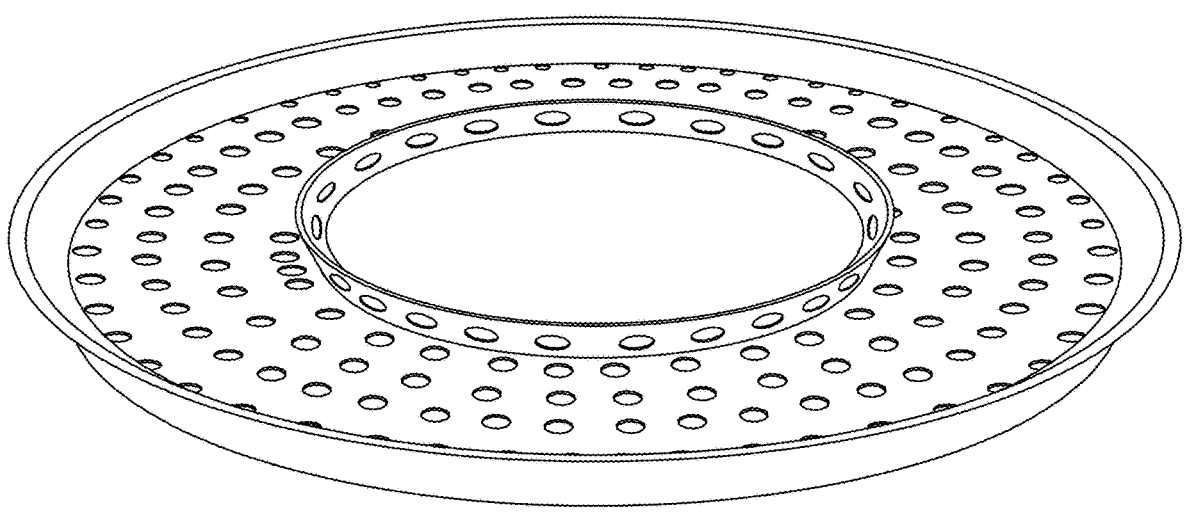
FIG. 13 is an illustration of the diffuser used in Example 2.
Figure 14:
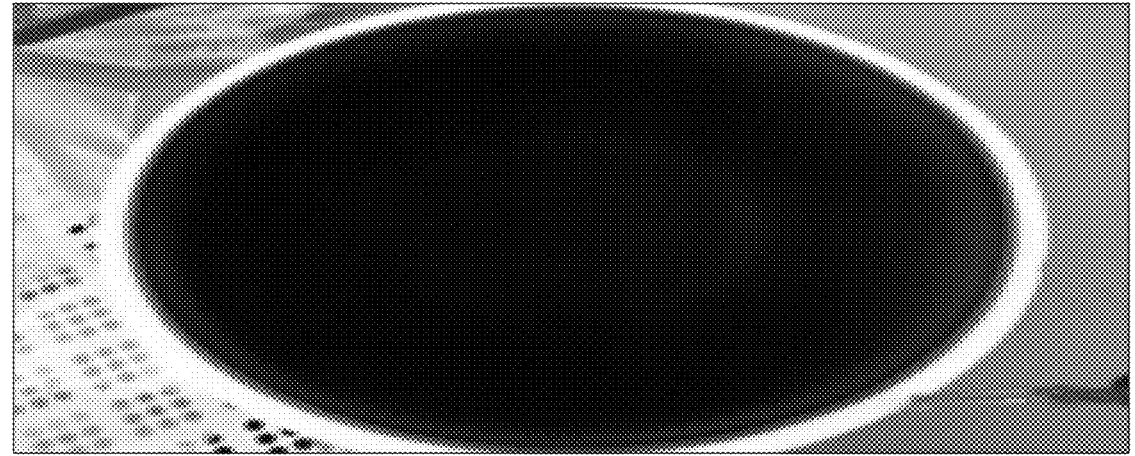
FIG. 14 is a photograph of the dome after etching in Example 2.

In Example 2, the diffuser included a perforated plate with a circumferential sidewall. Instead of a central cone, the diffuser used a smaller solid plate with a perforated circumferential sidewall in the center. This is illustrated in FIG. 13. FIG. 14 is a photograph of the dome of Example 2 after the test. In Example 2, the wind speed was 2.0 to 2.3 L/min. Good polymer deposition uniformity was observed.

Figure 15:
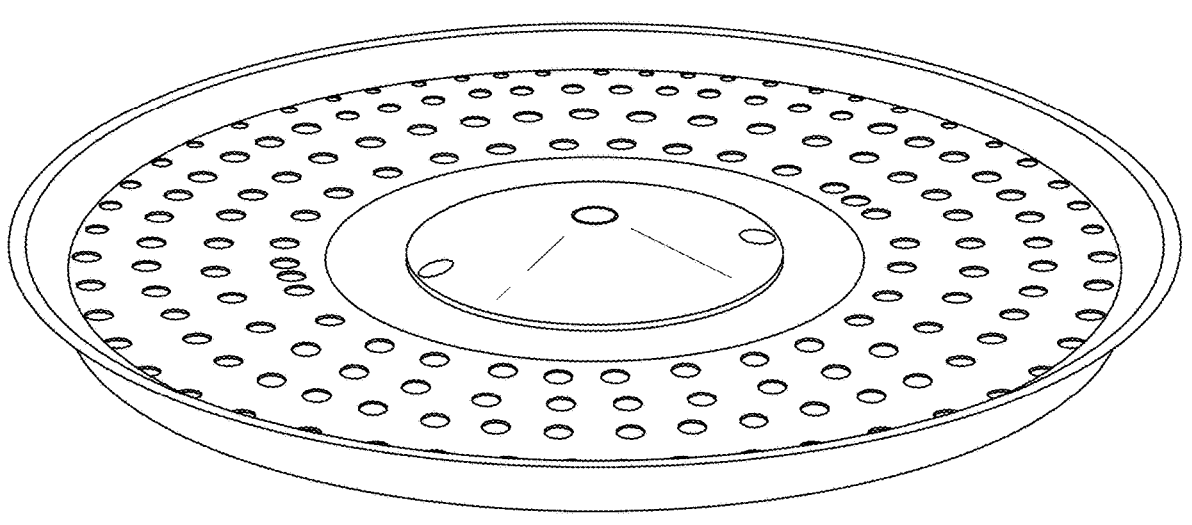
FIG. 15 is an illustration of the diffuser used in Example 3.
Figure 16:
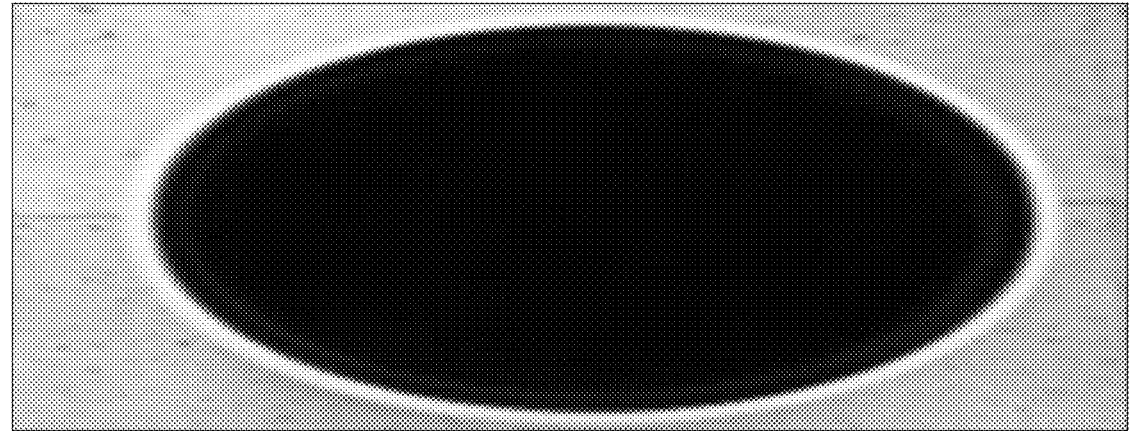
FIG. 16 is a photograph of the dome after etching in Example 3.

In Example 3, the diffuser included a perforated plate, a central cone, and a circumferentially extending sidewall as illustrated in FIG. 15. FIG. 16 is a photograph of the dome of Example 3 after the test. In Example 3, the wind speed was 3 to 4 L/min. This wind speed was larger than that of Example 2. Advantageously, Example 3 resulted in good heat dissipation efficiency and good (i.e., uniform) polymer deposition uniformity. Additionally, this example was stable and good temperature control was obtained.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

12

What is claimed is:

1. A plasma etching system, comprising:
   a plasma etching chamber comprising a dome, the dome comprising an inner surface partially defining the plasma etching chamber;
   a cooling chamber comprising a gas inlet and partially defined by an outer surface of the dome; and
   a diffuser within the cooling chamber and in fluid communication with the gas inlet, the diffuser comprising:
      a circular perforated plate comprising a central portion and a plurality of arrays of holes, each array being located circumferentially at a different distance from the central portion, and wherein the central portion has no through-holes; and
      a cone extending from the central portion and away from the dome.

2. The plasma etching system of claim 1, wherein the diffuser further comprises an outer sidewall extending from an outer circumference of the perforated plate and away from the dome.

3. The plasma etching system of claim 2, wherein the outer sidewall has a height of about 15 mm to about 25 mm.

4. The plasma etching system of claim 1, wherein the dome comprises a ceramic material.

5. The plasma etching system of claim 1, wherein the plurality of arrays comprises at least three arrays.

6. The plasma etching system of claim 1, wherein the plurality of arrays comprises four arrays.

7. The plasma etching system of claim 1, wherein the cone comprises a central hole.

8. The plasma etching system of claim 1, wherein each hole has a diameter of about 3 mm to about 6 mm.

9. The plasma etching system of claim 1, wherein the holes in each array are independently and circumferentially spaced at a distance of about 3 mm to about 10 mm.

10. The plasma etching system of claim 1, wherein a first array of the plurality of arrays is spaced at a first distance of about 45 mm to about 50 mm from a center of the perforated plate.

11. The plasma etching system of claim 1, wherein the cone has a maximum diameter of about 20 mm to about 27 mm.

12. The plasma etching system of claim 1, wherein the plurality of arrays comprises:
   a first array at a first distance of from about 45 mm to about 50 mm from a center of the perforated plate;
   a second array at a second distance of from about 50 mm to about 60 mm from the center;
   a third array at a third distance of from about 60 mm to about 70 mm from the center; and
   a fourth array at a fourth distance of from about 70 mm to about 80 mm from the center.

13. The plasma etching system of claim 1, further comprising:
   a cooling pipe; and
   a gas inlet;
   wherein the cone extends into the gas inlet.

14. A plasma etching system, comprising:
   a plasma etching chamber comprising a dome; and
   a cooling chamber above the dome; and
   a diffuser within the cooling chamber, the diffuser comprising:
      a circular perforated plate comprising a central portion and a plurality of arrays of holes, each array being located circumferentially at a different distance from the central portion, and wherein the central portion has no through-holes; and a cone extending from the central portion and away from the dome.

15. The plasma etching system of claim 14, wherein the diffuser further comprises:

an outer sidewall extending from an outer circumference of the perforated plate and away from the dome.

16. The plasma etching system of claim 14, wherein a gas is provided through the diffuser towards a surface of the dome, the gas being compressed dry air.

17. The plasma etching system of claim 16, wherein the gas is provided at a temperature of about 20° C. to about 25° C.

18. The plasma etching system of claim 16, wherein the gas flows through the diffuser at a rate of about 2 L/min to about 4 L/min.

19. A plasma etching system, comprising:

a plasma etching chamber and a cooling chamber separated by a dome; and a gas inlet and a diffuser within the cooling chamber, wherein the diffuser comprises:

a circular perforated plate comprising a central portion and a plurality of arrays of holes, each array being located circumferentially at a different distance from the central portion, and wherein the central portion has no through-holes, and wherein the perforated plate has a uniform thickness along its diameter; and a cone extending from the central portion and away from the dome; and wherein the cone and the central portion of the circular perforated plate are located below the gas inlet; and one or more heat sources in the cooling chamber located to a side of the diffuser.

20. The plasma etching system of claim 19, wherein the diffuser further comprises an outer sidewall extending from an outer circumference of the perforated plate and away from the dome.

\* \* \* \* \*